United States Patent
He

(10) Patent No.: US 9,312,328 B2
(45) Date of Patent: Apr. 12, 2016

(54) SMALL PITCH PATTERNS AND FABRICATION METHOD

(71) Applicant: Semiconductor Manufacturing International Corp., Shanghai (CN)

(72) Inventor: Qiyang He, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 28 days.

(21) Appl. No.: 13/831,987

(22) Filed: Mar. 15, 2013

(65) Prior Publication Data

US 2014/0138800 A1    May 22, 2014

(30) Foreign Application Priority Data

Nov. 21, 2012    (CN) .......................... 2012 1 0477231

(51) Int. Cl.
*H01L 21/461*    (2006.01)
*H01L 29/02*    (2006.01)
*H01L 21/033*    (2006.01)

(52) U.S. Cl.
CPC ............ *H01L 29/02* (2013.01); *H01L 21/0337* (2013.01)

(58) Field of Classification Search
CPC ... H01L 29/02; H01L 21/461; H01L 21/0337; H01L 21/32139; H01L 21/31144; H01L 21/0338

USPC .................................. 438/717; 257/E21.038
See application file for complete search history.

(56) References Cited

U.S. PATENT DOCUMENTS

| | | | | |
|---|---|---|---|---|
| 6,667,237 | B1* | 12/2003 | Metzler | 438/690 |
| 6,955,961 | B1* | 10/2005 | Chung | 438/241 |
| 8,163,190 | B2* | 4/2012 | Moon | 216/41 |
| 8,334,211 | B2* | 12/2012 | Kewley | 438/696 |
| 8,609,489 | B2* | 12/2013 | Kewley et al. | 438/264 |
| 2007/0099431 | A1* | 5/2007 | Li | 438/735 |
| 2007/0249170 | A1* | 10/2007 | Kewley | 438/706 |
| 2007/0264830 | A1* | 11/2007 | Huang et al. | 438/694 |
| 2009/0093121 | A1* | 4/2009 | Moon | 438/696 |
| 2009/0146322 | A1 | 6/2009 | Weling et al. | |
| 2009/0305166 | A1* | 12/2009 | Shiobara et al. | 430/312 |
| 2012/0282779 | A1* | 11/2012 | Arnold et al. | 438/703 |

* cited by examiner

*Primary Examiner* — Latanya N Crawford
(74) *Attorney, Agent, or Firm* — Anova Law Group, PLLC

(57) ABSTRACT

A method is provided for fabricating small pitch patterns. The method includes providing a semiconductor substrate, and forming a target material layer having a first region and a second region on the semiconductor substrate. The method also includes forming a plurality of discrete first sacrificial layers on the first region of the target material layer and a plurality of discrete second sacrificial layers on the second region of the target material layer, and forming first sidewall spacers on both sides of the discrete first sacrificial layers and the discrete second sacrificial layers. Further, the method includes removing the first sacrificial layers and the second sacrificial layers, and forming second sidewall spacers. Further, the method also includes forming discrete repeating patterns in the first region of the target material layer and a continuous pattern in the second region of the target material layer.

20 Claims, 6 Drawing Sheets

SMALL PITCH PATTERNS AND FABRICATION METHOD

CROSS-REFERENCES TO RELATED APPLICATIONS

This application claims the priority of Chinese patent application No. 201210477231.2, filed on Nov. 21, 2012, the entirety of which is incorporated herein by reference.

FIELD OF THE INVENTION

The present invention generally relates to the field of semiconductor manufacturing technology and, more particularly, relates to semiconductor structures with small pitch patterns and fabrication techniques.

BACKGROUND

With the continuously shrinking of minimum designed line widths and pitchs of integrated circuits, when a critical dimension of exposed lines approaches a theoretical limitation of the resolution of an exposure system, the image formed on a substrate may be seriously distorted, and quality of patterns formed by a lithography process may be significantly reduced. In order to minimize an optical proximity effect (OPE), resolution enhanced techniques (RETs) are developed by semiconductor industries. Amongst of RETs, a double patterning technique (DPT) attracts intensive attentions, it is considered as a practical way to bridge the gap between an immersion lithography and an extreme ultraviolet (EUV) lithography.

The existing method for forming small pitch patterns having alternatively aligned lines and spaces is often a self-aligned double patterning (SADP) technique. The SADP technique for forming small pitch patterns, illustrated in FIGS. 1-5, may include: forming a target material layer 20 (may refer to a to-be-etched layer) on a semiconductor substrate 10, as shown in FIG. 1; forming a sacrificial material layer on the target material layer 20 (not shown), and patterning the sacrificial layer 30, as shown in FIG. 2; forming a sidewall layer on surface of the sacrificial layer 30 and the exposed portion of the target material layer 20, and forming sidewalls 40 by anisotropically etching the sidewall layer, as shown in FIG. 3. A width of the sidewalls 40 may be a line width of later-formed small pitch patterns, the width of the interspace of sidewalls 40 may be a space of the later-formed small pitch patterns. Further, the SADP technique for forming small pitch patterns includes removing the sacrificial layer 30, as show in FIG. 4, and forming small pitch patterns 21 by etching the target material layer 20 using the sidewalls 40 as a mask, as shown in FIG. 5.

Although, the existing SADP technique may form repeating patterns with small line widths and spaces on a semiconductor substrate, if large scale patterns are needed to be formed on other areas of the semiconductor substrate, the small patterns and the large patterns may need to be formed separately, the fabrication process may be complex. The disclosed methods and systems are directed to solve one or more problems set forth above and other problems.

BRIEF SUMMARY OF THE DISCLOSURE

One aspect of the present disclosure includes a method for fabricating small pitch patterns. The method includes providing a semiconductor substrate, and forming a target material layer having a first region and a second region on the semiconductor substrate. The method also includes forming a plurality of discrete first sacrificial layers on the first region of the target material layer and a plurality of discrete second sacrificial layers on the second region of the target material layer, and forming first sidewall spacers on both sides of the discrete first sacrificial layers and the discrete second sacrificial layers. Further, the method includes removing the first sacrificial layers and the second sacrificial layers, and forming second sidewall spacers. Further, the method also includes forming discrete repeating patterns in the first region of the target material layer and a continuous pattern in the second region of the target material layer.

Another aspect of the present disclosure includes a semiconductor structure. The semiconductor structure includes a semiconductor substrate having a first region and a second region. The semiconductor structure also includes a plurality of discrete repeating patterns on the first region of the semiconductor substrate. Further, the semiconductor structure includes a continuous pattern on the second region of the semiconductor substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 13:
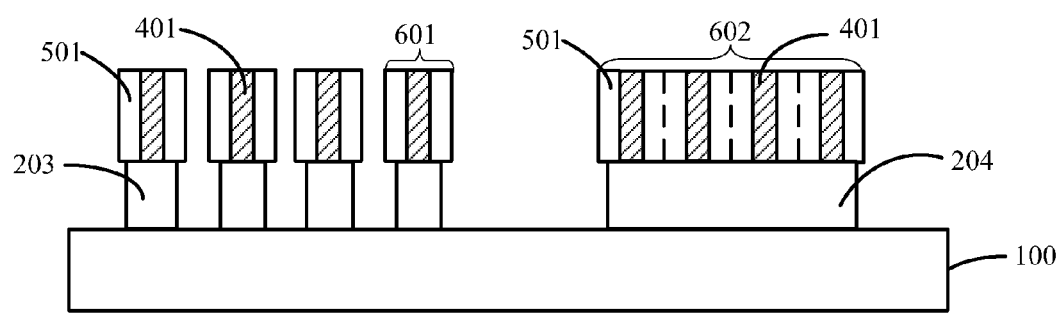
Figure 14:
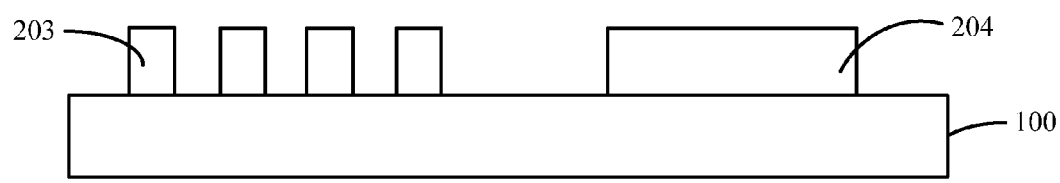
Figure 15:
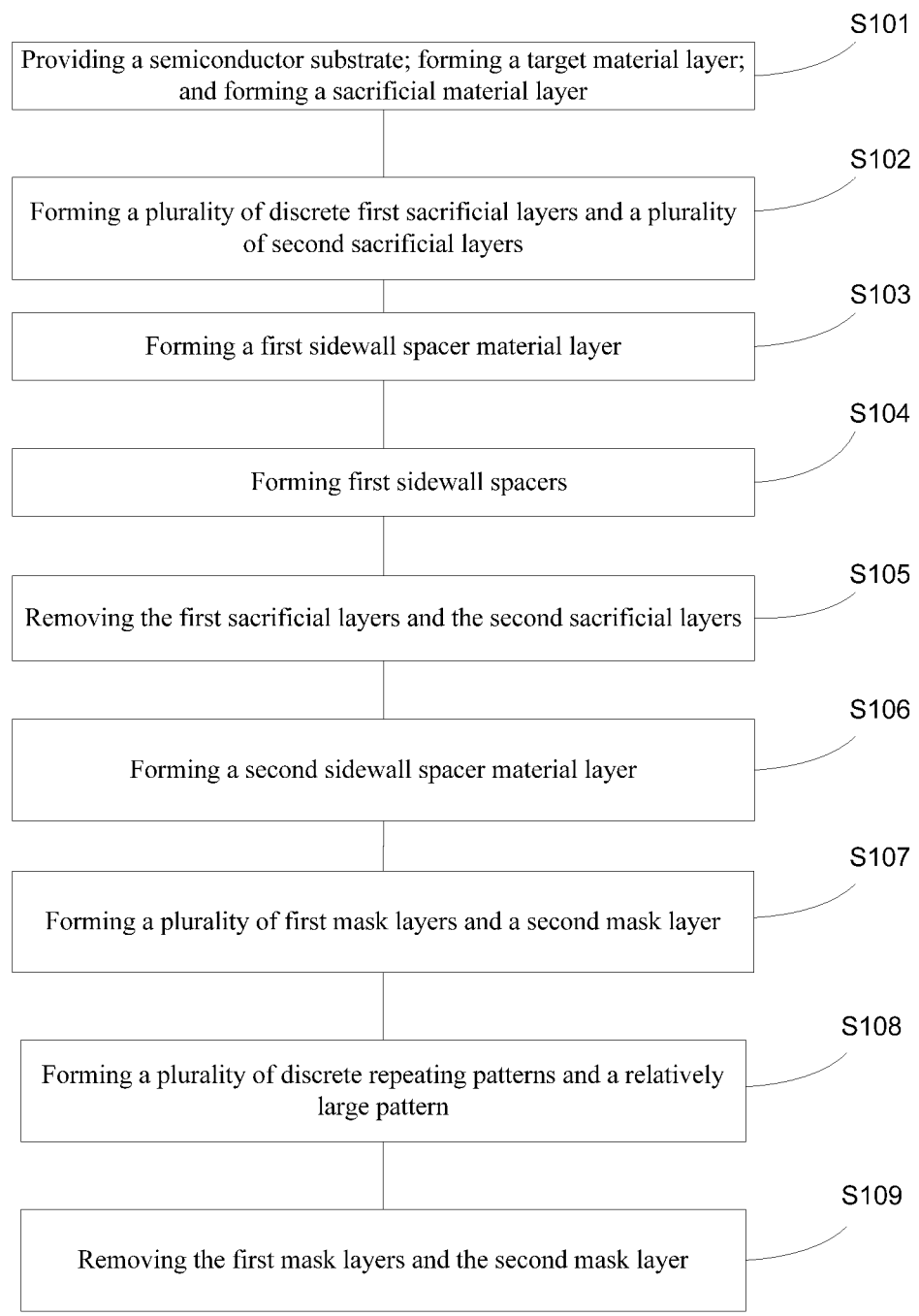
FIG. 15 illustrates an exemplary fabrication process for small pitch patterns consistent with the disclosed embodiments.

FIG. 15 illustrates an exemplary fabrication process of a small pitch patterns consistent with the disclosed embodiments. FIGS. 6-14 illustrate semiconductor structures corresponding to certain stages of the exemplary fabrication process.

Figure 1:
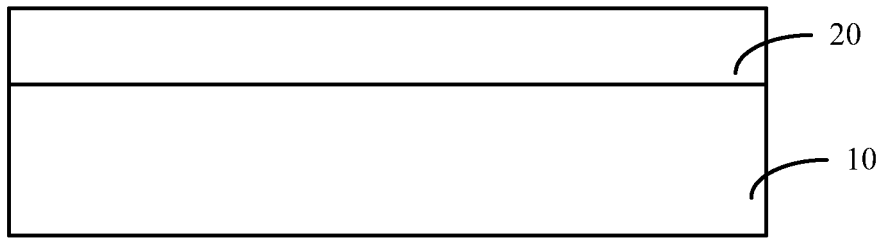
FIGS. 1-5 illustrate semiconductor structures corresponding to certain stages of an existing self-aligned double patterning (SADP) technique for forming small pitch patterns.
Figure 2:
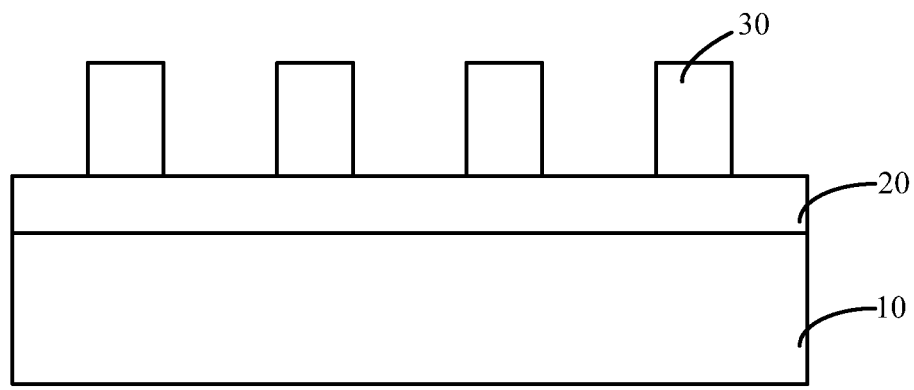
Figure 3:
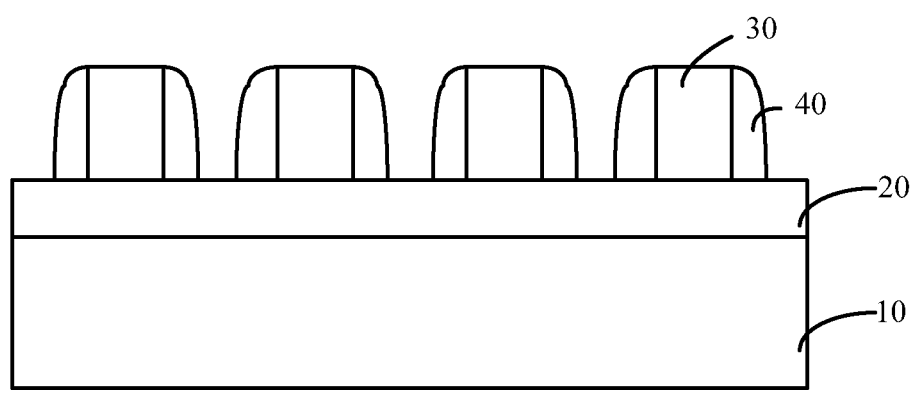
Figure 4:
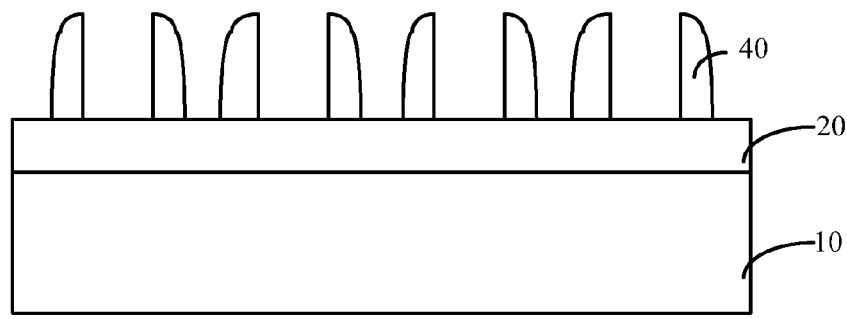
Figure 5:
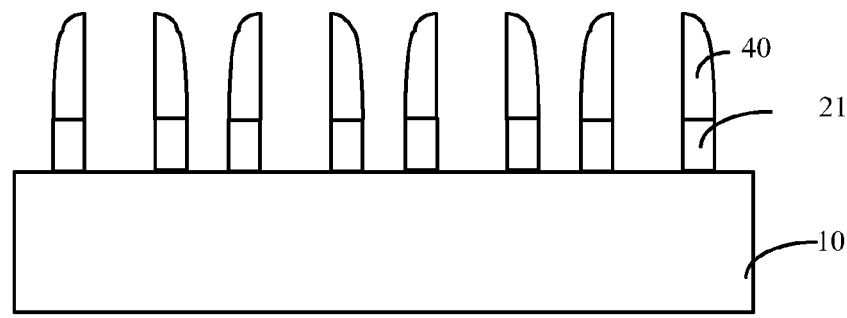
Figure 6:
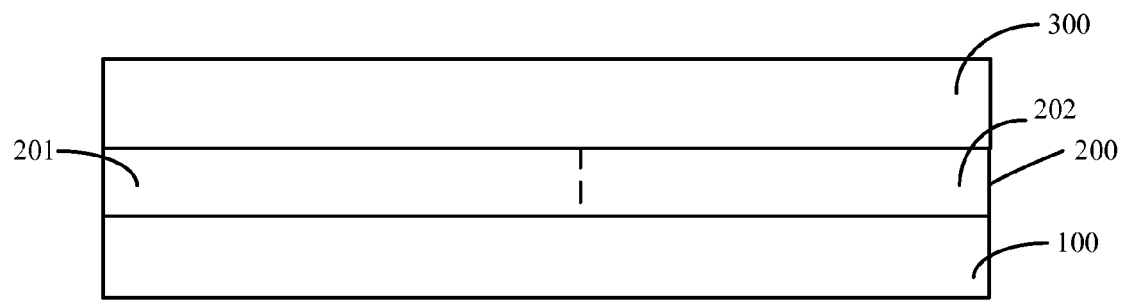
FIGS. 6-14 illustrate semiconductor structures corresponding to certain stages of an exemplary fabrication process for small pitch patterns consistent with the disclosed embodiments.

As shown in FIG. 15, at the beginning of the fabrication process, a semiconductor substrate with certain structures is provided (S101). FIG. 6 shows a corresponding semiconductor structure.

As shown in FIG. 6, a semiconductor substrate 100 is provided. The semiconductor substrate 100 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials and/or silicon on insulator (SOI). The semiconductor substrate 100 may also provide a base for subsequent processes and structures After providing the semiconductor substrate 100, a target material layer 200, i.e., a layer is to be etched to form final patterns, may be formed one surface of the semiconductor substrate 100. The target material layer 201 may be made of one or more of silicon oxide, silicon nitride, poly silicon, siliconoxynitride, siliconoxycarbide, amorphous carbon carbonsiliconoxynitride, low-K material and metal layer, etc. The target material layer 200 may be formed by any appropriate process, such as a chemical vapor deposition (CVD) process, a physical vapor deposition (PVD) process, a thermal oxidation process, or a chemical oxidation process, etc.

The target material layer 200 may have a first region 201 and a second region 202. Later-formed small scale small pitch patterns may be formed in the first region 201, and later-formed large scale patterns may be formed in the second region 202.

Further, a sacrificial material layer 300 may be formed on the target material layer 200. The sacrificial material layer 300 may be made of one or more of photo resist, bottom anti-reflection layer, organic thin film, amorphous carbon, dielectric film and metal layer, etc. Other appropriate materials may also be used for the sacrificial material layer 300. The sacrificial material layer 300 may be formed by any appropriate process, such as a CVD process, a PVD process, or a spin coating process, etc. In one embodiment, the sacrificial material layer 300 is a photo resist layer formed by a spin-coating process.

Figure 7:
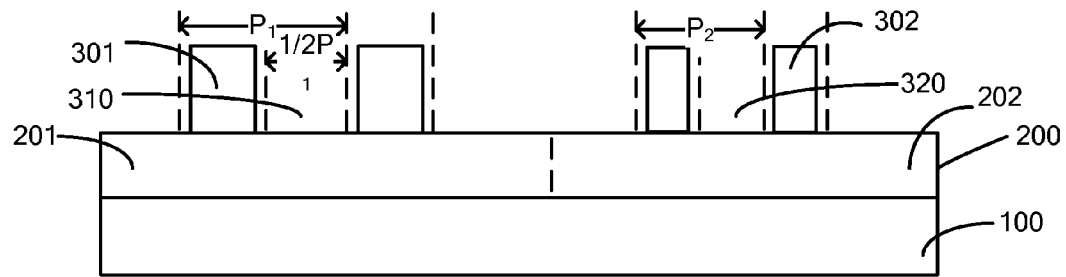

Returning to FIG. 15, after providing the semiconductor substrate 100 with the target material layer 200 and the sacrificial material layer 300, a plurality of discrete first sacrificial layers may be formed on one surface of the first region 201, and a plurality of discrete second sacrificial layers may be formed on the surface of the second region 202 (S 102). FIG. 7 illustrates a corresponding structure.

As shown in FIG. 7, a plurality of discrete first sacrificial layers 301 (may refer to first core structures) are formed on the surface of the first region 201 of the target material layer 200, and a plurality of discrete second sacrificial layers 203 (may refer to second core structures) are formed on the surface of the second region 202 of the target material layer 200. The discrete first sacrificial layers 301 and the discrete second sacrificial layers 302 may be formed by various appropriate methods.

In one embodiment, when the sacrificial material layer 300 is a photo resist layer, a photo lithography process may be used to form the discrete first sacrificial layer 301 and the discrete second sacrificial layer 302. In certain other embodiments, if the sacrificial material is made of one of anti-reflection coating, organic material, amorphous carbon, dielectric material and metal, the discrete first sacrificial layers 301 and the discrete second sacrificial layers 302 may be formed by one or more of a photo lithography process, a plasma etching process, a wet etching process, an ashing process, a nano imprinting process, and a self assembly process, etc.

Referring to FIG. 7, the width of each of the discrete first sacrificial material layers 301 may be identical, and may be defined as $CD_{core1}$. There may be a first space 310 between the two adjacent discrete first sacrificial layers 301. The discrete first sacrificial layers 301 and the first spaces 310 in between may form a plurality of periodic patterns. A width of a period, i.e., one discrete first sacrificial layer 301 and one first space 310, may refer to a first node distance $P_1$, the width of each of the discrete first sacrificial layers 301 may be smaller than $½P_1$, i.e., half of the first node distance $P_1$.

The width of each of the discrete second sacrificial layers 302 may be identical, and may be defined as $CD_{core2}$. There may be a second space 320 between the two adjacent discrete second sacrificial layers 302. The discrete second sacrificial layers and the second spaces 310 in between may form a plurality of periodic patterns. A width of a period, i.e., one discrete second sacrificial material layer 302 and one second space 320, may refer to a second node distance $P_2$, the width of each of the discrete second sacrificial layer 302 may be smaller than $½P_2$, i.e., half of the second node distance $P_2$. The first node distance $P_1$ may be greater than the second node distance $P_2$, i.e., $P_1 > P_2$. $P_1$ and $P_2$ may be designed as various appropriate values, in one embodiment, $P_1$ may be approximately 128 nm, and $P_2$ may be approximately 108 nm.

Figure 8:
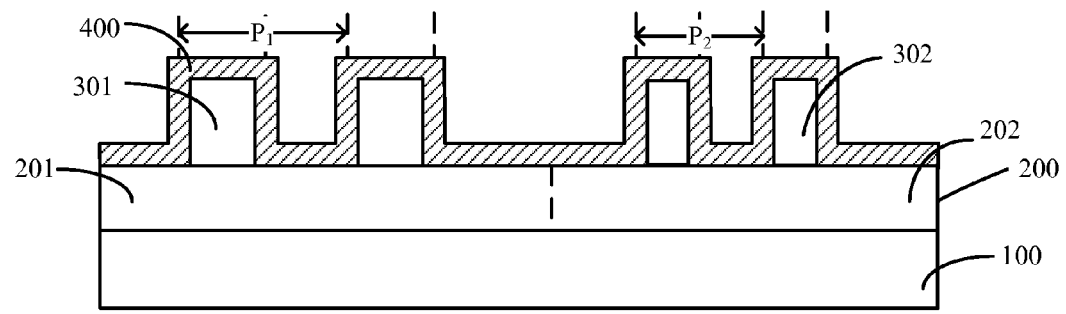

Returning to FIG. 15, after forming the discrete first sacrificial layers 301 and the discrete second sacrificial layers 302, a first sidewall spacer material layer may be formed (S103). FIG. 8 illustrates a corresponding structure.

As shown in FIG. 8, a first sidewall spacer material layer 400 is formed on the surface of the target material layer 200 and the surface of the discrete first sacrificial layers 301 and the discrete second sacrificial layers 302. The first sidewall spacer material layer 400 may cover the top surface and sidewalls of the discrete first sacrificial layers 301 and the discrete second sacrificial layers 302. The first sidewall spacer material layer 400 may be made of any appropriate materials, such as photo resist, bottom anti-reflection coating, organic material, amorphous carbon, dielectric material or metal, etc.

Material of the first sidewall spacer material layer 400 may be different from material of the discrete first sacrificial layers 301 and the discrete second sacrificial layers 302, so as to ensure the material of the first sidewall spacer material layer 400 and the material of the discrete first sacrificial layers 301 and the discrete second sacrificial layers 302 to have a high selective etching ratio. The first sidewall spacer material layer 400 may be formed by any appropriate method, such as a spin-coating process, a CVD process, a PVD process, or an atomic layer deposition (ALD) process. A thickness of the first sidewall spacer material layer 400 may be in a range of approximately 5 nm~20 nm. In one embodiment, the sidewall spacer material layer 400 is dielectric silicon oxide formed by an ALD process, and a thickness is approximately 18 nm.

Figure 9:
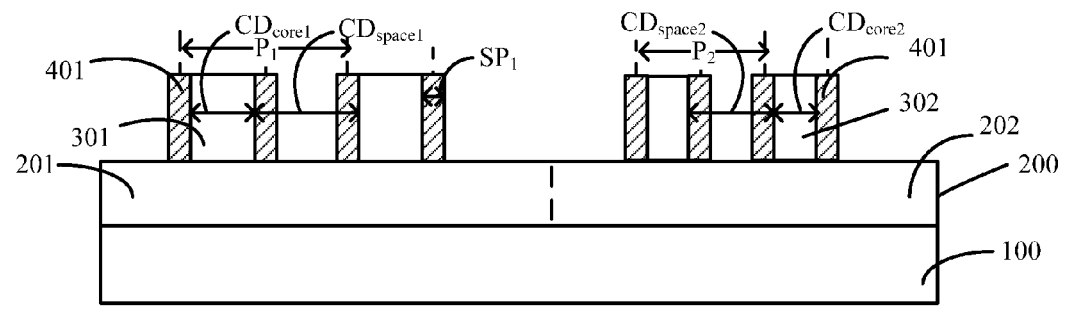

Returning to FIG. 15, after forming the first sidewall spacer material layer 400, first sidewall spacers may be formed by etching the sidewall spacer material layer 400 (S104). FIG. 9 illustrates a corresponding structure.

As show in FIG. 9, a plurality of first sidewall spacers 401 are formed on the sidewalls of the discrete first sacrificial layers 301 and the discrete second sacrificial layers 302. The first sidewall spacers 401 may be formed by any appropriate process. For example, a mask-less etching process may be used to etch the first sidewall spacer material layer to form the first sidewall spacers 401. The mask-less etching process may refer to an etch back process. Various etching methods may be used for the mask-less etching process, such as a plasma etching process, an ion beam etching process or a wet etching process, etc.

In one embodiment, the etching process may a plasma etching process. A plasma may vertically etch the first sidewall spacer material layer 400 until a portion of the first sidewall spacer material layer 400 on the surface of the target material layer 200 and the top surface of the discrete first sacrificial layers 301 and the discrete second sacrificial layers 302 are completely removed. Therefore the sidewall spacers 401 covering the sidewalls of the discrete first sacrificial layers 301 and the sidewalls of the discrete sacrificial layer 302 are formed. A thickness of the first sidewall spacers 401 may be similar as the thickness of the first sidewall spacer material layer 400, which may in a range of approximately 5 nm~20 nm.

Referring to FIG. 9, a distance between the two adjacent discrete first sacrificial layers 301 may be defined as $CD_{space1}$, a distance between the two adjacent discrete second sacrificial layers 302 may be defined as $CD_{space2}$; and the thickness of the first sidewall spacers 401 may be defined as $SP_1$. Therefore, $CD_{space1}=\frac{1}{2}P_1+SP_1$, and $CD_{space2}=\frac{1}{2}P_2+SP_1$. Because $P_1 > P_2$, $CD_{space1} > CD_{space2}$. By adjusting the thickness of the first sidewall spacers 401, equal distances of the adjacent sidewall spacers 401 may be obtained, that is:

$$CD_{core1}=CD_{space1}-2SP_1=\frac{1}{2}P_1+SP_1-2SP_1=\frac{1}{2}P_1-SP_1;$$
and $$CD_{core2}=CD_{space2}-2SP_1=\frac{1}{2}P_1+SP_1-2SP_1=\frac{1}{2}P_2-SP_1$$

Therefore, when the discrete first sacrificial layers 301 and the discrete second sacrificial layers 302 are formed, the difference between the width of each of the discrete second sacrificial layers 302 $CD_{core2}$ and one half of the second node distance ($\frac{1}{2}P_2$) may be equal to the difference between the width of each of the discrete first sacrificial layers 301 $CD_{core1}$ and one half of the first node distance ($\frac{1}{2}P_1$), which may be equal to the width of the first sidewall spacers 401 $SP_1$. In one embodiment, $SP_1$ may be approximately 18 nm, thus the width of the discrete first sacrificial material layers 301 $CD_{core1}=\frac{1}{2}P_1-SP_1$ may be approximately 46 nm, and the width of the discrete second sacrificial layers 302 $CD_{core2}=\frac{1}{2}P_2-SP_1$ may be approximately 36 nm.

Figure 10:
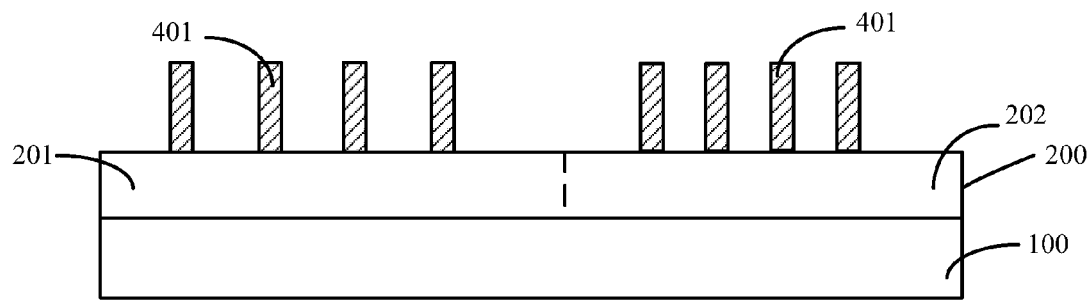

Returning to FIG. 15, after forming the first sidewall spacers 401, the discrete first sacrificial material layers 301 and the discrete second sacrificial material layers 302 may be removed (S105). FIG. 10 illustrates a corresponding structure.

As shown in FIG. 10, the discrete first sacrificial layers 301 and the discrete second sacrificial layers 302 are removed, and the first sidewall spacers 401 remain on the surface of the target material layer 200. The discrete first sacrificial layers 301 and the discrete second sacrificial layers 302 may be removed by various processes, such as an ashing process, a plasma etching process, or a wet etching process, etc.

In one embodiment, when the discrete first sacrificial layers 301 and the discrete second sacrificial layers 302 are made of photo resist, an ashing process may be used. Oxygen may be used as a reaction gas for the ashing process. Oxygen plasma may be created by ionizing the oxygen gas, and the oxygen plasma may react with the discrete first sacrificial layers 301 and the discrete second sacrificial layers 302. Volatile carbon monoxide, carbon dioxide and water may be generated as the reaction products, thus the discrete first sacrificial layers 301 and the discrete second sacrificial layers 302 may be removed.

Further, other appropriate gases may also be included in the reaction gas of the ashing process, such as $N_2$, $H_2$, Ar, or a combination thereof. In one embodiment, one of $N_2$ and $H_2$ is included in the reaction gas of the ashing process, which may enhance the ability for removing the sacrificial photo resist and residue polymers. After removing the discrete first sacrificial layers 301 and the discrete second sacrificial layers 302, the distance between the two adjacent first sidewall spacers 401 on the first region 201 may be greater the distance between the two adjacent first sidewall spacers 401 on the second region 202.

Figure 11:
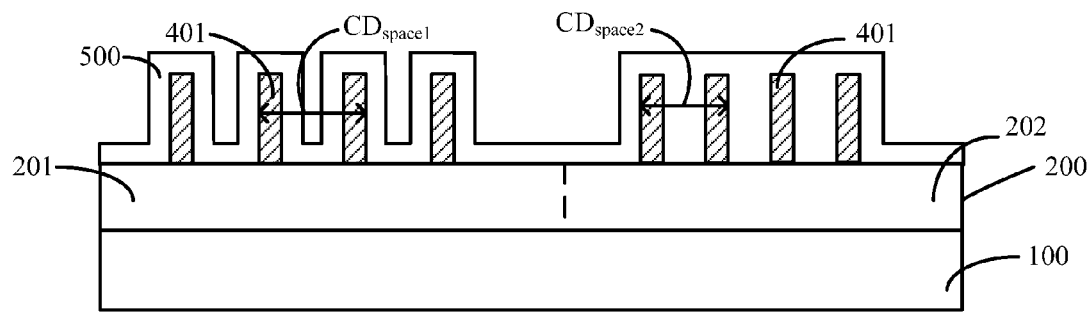

Returning to FIG. 15, after removing the discrete first sacrificial layers 301 and the discrete second sacrificial layers 302, a second sidewall spacer material layer may be formed (S106). FIG. 11 illustrates a corresponding structure.

As shown in FIG. 11, a second sidewall spacer material layer 500 is formed on the surface of the target material layer 200 and surfaces of the first sidewall spacers 401. The second sidewall spacer material layer 500 may be made of any appropriate material, such as photo resist, bottom anti-reflection coating, organic material, amorphous carbon, dielectric material, or metal material, etc. Various processes may be used to form the second sidewall spacer material layer 500, such as a spin-coating process, a CVD process, a PVD process, or an ALD process, etc. In embodiment, the second sidewall spacer material layer 500 is silicon nitride formed by a CVD process. A thickness of the second sidewall spacer material layer 500 may be in a range of approximately 5 nm-50 nm.

By adjusting the thickness of the second sidewall spacer material layer 500, spaces between the two adjacent first sidewall spacers 401 on the surface of the second region 202 of the target material layer 200 may be just completely filled, i.e., the distance between the two adjacent first sidewall spacers 401 on the surface of the second region 202 of the target material layer 200 is two times of a thickness of the second sidewall material layer 500. Because the distance between the two adjacent first sidewall spacers 401 on the surface of the first region 201 of the target material layer 200 may be greater than the distance between the two adjacent first sidewall spacers 401 on the surface of the second region 202 of the target material layer 200, the second sidewall spacer material layer 500 may be unable to completely fill spaces between the two adjacent sidewall spacers 401 on the surface of the first region 201 of the target material layer 200.

Figure 12:
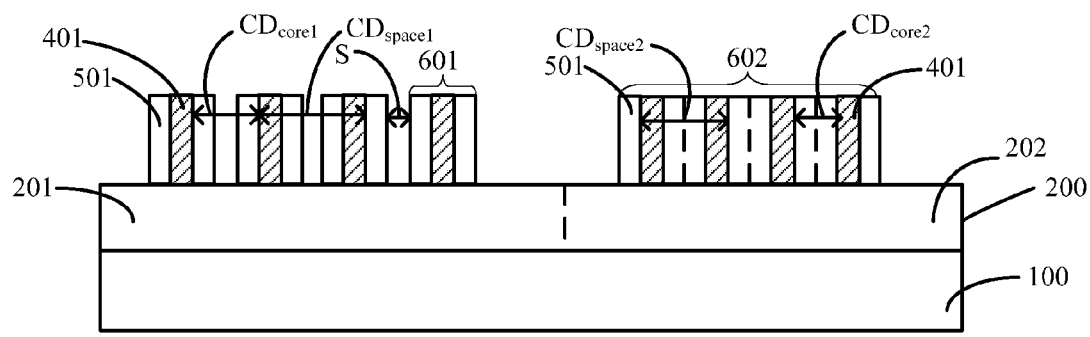

Returning to FIG. 15, after forming the second sidewall spacer material layer 500, second sidewall spacers, a plurality of first mask layers and a second mask layer may be formed (S107). FIG. 12 illustrates a corresponding structure.

As shown in FIG. 12, a plurality of second sidewall spacers 501 are formed on both sidewalls of each of the first sidewall spacers 401. The first sidewall spacers 401 and the second sidewall spacers 501 on the surface of the first region 201 of the target material layer 200 may form a plurality of discrete first mask layers 601. The first sidewall spacers 401 and the second sidewall spacers 501 on the surface of the second region 202 of the target material layer 200 may for a continuous second mask layer 602. The sidewall spacers 501, the discrete first mask layers 601 and the second mask layer 602 may be formed by any appropriate process, such as a plasma etching process, an ion beam etching process, or a wet etching process, etc.

In one embodiment, the second sidewall spacers 501, the discrete first mask layers 601 and the second mask layer 601 are formed by a plasma etching process using certain appropriate reaction gas. The second sidewall spacer material layer 500 may be vertically etched by a plasma process until a portion of the second sidewall spacer material layer 500 on the surface of the target material layer 200 and the top surface of the first sidewall spacers 401 are completely removed, thus the second sidewall spacers 501 covering the sidewalls of the first sidewall spacers 401 are formed after the plasma etching process. A thickness of the second sidewall spacers 501 may be equal to the thickness of the second sidewall spacer material layer 500, which may be in a range of approximately 5 nm~50 nm.

Referring to FIG. 12, the distance between the adjacent discrete first mask layers 601 may be equal, and may be defined as S. The thickness of the second sidewall spacers 501 may be defined as $SP_2$. Therefore, $CD_{space1}=S+2SP_1+2SP_2$, $CD_{space2}=2SP_2+2SP_1$, and $CD_{core1}=2SP_2+S$. Further, referring to FIG. 9, the first node distance $P_1=CD_{core1}+CD_{space1}$, therefore, $P_1=CD_{core1}+CD_{space1}=2SP_2+S+2SP_2+2SP_1+S=4SP_2+2SP_1+2S$. Further, the second node distance $P_2=CD_{core2}+CD_{space2}$, $CD_{core2}=2SP_2$, and $CD_{space2}=2SP_2+2SP_1$, thus $P_2=CD_{core2}+CD_{space2}=2SP_2+2SP_2+2SP_1=4SP_2+2SP_1$. Therefore, $P_2=P_1-2S$.

In one embodiment, the first node distance $P_1$ is approximately 128 nm, the second node distance $P_2$ is approximately 108 nm, therefore the distance S between the two adjacent first mask layers 601 may be approximately 10 nm. Other appropriate values of the $P_1$ and $P_2$ may also be used to fabricate patterns with the desired distance S between the two adjacent first mask layers 601.

In certain other embodiment, two times of the thickness of the second sidewall spacers 501 may be smaller than the distance between two adjacent first sidewall spacer 401, thus discrete second mask layers may be formed. A distance between the adjacent first mask layers 601 may be different from the distance of the discrete second mask layers, therefore, discrete patterns may be formed in the second region 202 after subsequent etching process. A distance between adjacent patterns in the second region 202 and a distance between adjacent subsequently formed patterns in the first region 201 may be equal and/or different.

Returning to FIG. 15, after forming the discrete first mask layer 601 and the second mask layer 602, a plurality of discrete repeating patterns may be formed in the first region 201 and a continuous pattern may be form in the second region 202 (S108). FIG. 13 illustrates a corresponding structure.

As shown in FIG. 13, a plurality of discrete repeating patterns 203 is formed in the first region 201 of the target material layer 200, and a continuous pattern 204 with a relatively large size is formed in the second region of the target material layer 200. Various processes may be used to etch the target material layer 200 to form the discrete repeating patterns 203 and the continuous pattern 204, such a plasma etching process, an ion beam etching process, or a wet etching process, etc. In one embodiment, a plasma etching process may used to etching the target material layer 200.

When forming small pitch patterns using a single spacer formation process, the thickness of the first sidewall spacer is relatively small, a dry etching process may damage the first sidewall spacer when the target material layer is etched, the shape of the first sidewall spacer may change, and the final patterns formed by etching the target material layer may be affected. Further, the non-uniformity of the plasma process and the scattering between the plasma ions may cause a lateral damage on the target material layer besides the vertically etching, thus the final size of the patterns may be smaller than the size of the first sidewall spacer. Therefore, the size of the finally obtained patterns may be smaller the designed size, and unable to match the requirements.

By adding a second sidewall spacer in the formation process, the second sidewall spacers 501 are formed to cover the first sidewall spacers 401, the size of the mask patterned by the first sidewall spacers 401 and the second sidewall spacers 501 may greater than the designed size of the final discrete repeating patterns 203 and the final contiguous pattern 204. A size lost during the plasma etching process may be compensated, and the final patterns may match the design requirement. Further, the size of the patterns of the first masks 601 and the second mask 602 may be adjusted by adjusting the thickness of the second sidewall spacers 501, thus the size of the final discrete repeating patterns 203 and the final continuous pattern may be adjusted.

The size of the continuous pattern 602 formed in the second region 202 of the target material layer 200 may have a minimum value $P_1-2S$. The minimum value $P_1-2S=P_2$, $P_2$ is the second node distance, which is also a period of the discrete second sacrificial material layers 302. On one hand, the second node distance $P_2$ may be unable to decrease infinitely because of the limitation of the exposure conditions of the second sacrificial material layers 302. If the second node distance $P_2$ is too small, it may be unable to form patterns with a uniformly precise size. Therefore, in one embodiment, the first node distance $P_1$ may be greater than 65 nm, and the distance between the adjacent discrete first mask layers 601 S may be smaller than 20% $P_1$.

On the other hand, if the second node distance $P_2$ is too small, referring to FIG. 12, $CD_{core2}=\frac{1}{2}P_2-SP_1$, the width of each of the discrete second sacrificial material layers 302, which is also the distance between the first sidewall spacers 401, may be too small too. The small $CD_{core2}$ may cause the first sidewall spacers 401 on the second region 202 of the target material layer 200 to be too dense. When the second sidewall spacers 501 are formed, the second sidewall spacer material layer 500 may be unable to fill in the spaces of the first sidewall spacers 401 on the second region 202 of the target material layer 200, the continuous second mask layer may be unable to be formed, thus the continuous pattern 204 may be unable to be formed.

Returning to FIG. 15, after forming the discrete repeating patterns 203 and the continuous pattern 204, the first mask layers 601 and the second mask layer 602 may be removed (S109). FIG. 14 illustrates a corresponding structure.

As shown in FIG. 14, the first mask layer 601 and the second mask layer 602 are removed from the top of the discrete patterns 203 and the continuous pattern 204. The first mask layers 601 and the second mask layer 602 may be removed by any appropriate process, such as a plasma etching process, an ashing process, a stripping process, or a wet etching process, etc.

After forming the discrete repeating patterns 203 and the continuous pattern 204, further fabrication processes, such as a doubled-splitting process for forming doubled-pitch patterns may be proceeded.

Thus, a semiconductor structure may be formed by the above disclosed processes and methods, and the corresponding structure is illustrated in FIG. 14. The semiconductor structure includes the semiconductor substrate 100 having a first region and a second region. The semiconductor structure also include a plurality of discrete repeating patterns 203 on the first region of the semiconductor substrate 100, and a continuous pattern 204 on the second region of the semiconductor substrate 100. The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating small pitch patterns device, comprising:
   providing a semiconductor substrate;
   forming a target material layer having a first region and a second region;
   forming a plurality of discrete first sacrificial layers on one surface of the first region of the target material layer and a plurality of discrete second sacrificial layers on the surface of the second region of the target material layer, wherein:
   widths of the first sacrificial layers are identical and defined as $CD_{core1}$, and the first sacrificial layers and spaces between two adjacent first sacrificial layers form a plurality of periodical patterns with a period of a first node distance defined as $P_1$; and widths of the second sacrificial layers are identical and defined as $CD_{core2}$, and the second sacrificial layers and spaces between two adjacent second sacrificial layers form a plurality of periodical patterns with a period of a second node distance defined as $P_2$, wherein the first node distance $P_1$ is greater than the second node distance $P_2$; $CD_{core1} < \frac{1}{2}P_1$; $CD_{core2} < \frac{1}{2}P_2$; and $\frac{1}{2}P_1 - CD_{core1} = \frac{1}{2}P_2 - CD_{core2}$;

forming first sidewall spacers on both sides of the discrete first sacrificial layers and the discrete second sacrificial layers;

removing the first sacrificial layers and the second sacrificial layers;

forming second sidewall spacers on both sides of each of the first sidewall spacers, wherein the first sidewall spacers and the second sidewall spacers form a plurality of discrete first mask layers on the first region of the target material layer and form a non-discrete second mask layer on the second region of the target material layer; and forming discrete repeating patterns in the first region of the target material layer and a non-discrete pattern in the second region of the target material layer.

2. The method according to claim 1, wherein:
the first sacrificial layers and the second sacrificial layers are made of one of photo resist, back anti-reflection coating, amorphous carbon, dielectric film, metal material, or a combination thereof.

3. The method according to claim 1, wherein:
the first sacrificial layers and the second sacrificial layers are formed by at least one of photo lithography process, a plasma etching process, a wet etching process, an aMetzlerg process, a striping process, a nano-imprinting process, and a directed self assembly process.

4. The method according to claim 1, wherein:
the first sidewall spacers and the second sidewall spacers are made of one of photo resist, back anti-reflection coating, organic material, amorphous carbon, dielectric material, metal material, or a combination of thereof.

5. The method according to claim 1, wherein:
the first sidewall spacers and the second sidewall spacers are formed by at least one of a spin-coating process, a chemical vapor deposition process, a physical vapor deposition process, an atomic layer deposition process and an epitaxial process.

6. The method according to claim 1, wherein:
the first sacrificial layers and the second sacrificial layers are removed by at least one of a plasma etching process, a wet etching process, an aMetzlerg process and a stripping process.

7. The method according to claim 1, after forming the discrete repeating patterns and the non-discrete pattern, further including:
forming double-pitch patterns and keeping a portion of original patterns at the same time.

8. The method according to claim 1, wherein:
distance between two adjacent first mask layers of the plurality of discrete first mask layers is defined as S;
$P_2$ is equal to $P_1 - 2S$; and
S is smaller than 20 % of $P_1$.

9. The method according to claim 8, wherein:
size of the non-discrete pattern is determined by S.

10. The method according to claim 8, wherein:
width of the non-discrete pattern formed in the second region of the target material layer is equal to, or greater than $P_1 - 2S$.

11. The method according to claim 1, wherein:
a width of the first sidewall spacers is defined as $SP_1$, $CD_{core1} = \frac{1}{2}P_1 - SP_1$, and $CD_{core2} = \frac{1}{2}P_2 - SP_1$.

12. The method according to claim 1, wherein:
the first sidewall spacers and the first sacrificial layers are made of different materials, and the first sidewall spacers and the second sacrificial layers are made of different materials.

13. The method according claim to 1, wherein:
thickness of the first sidewall spacers is in a range of approximately 5 nm -20 nm.

14. The method according claim to 1, wherein:
thickness of the second sidewall spacers is in a range of approximately 5 nm -50 nm.

15. The method according to claim 1, wherein:
sizes of the discrete repeating patterns in the first region of the target material layer and the non-discrete pattern in the second region of the target material layer are adjusted by the thickness of the second sidewall spacers.

16. The method according to claim 1, wherein:
a plasma etching process is used to etch the target material layer.

17. The method according to claim 1, wherein the discrete repeating patterns and the non-discrete pattern are formed simultaneously.

18. The method according to claim 1, wherein:
the discrete repeating patterns and the non-discrete pattern are made of one or more of silicon oxide, silicon nitride, poly silicon, siliconoxynitride, siliconoxycarbide, amorphous carbon or carbonsiliconoxynitride, low-K material and metal layers.

19. The method according to claim 1, wherein:
the first sidewall spacers and the second sidewall spacers in the plurality of discrete first mask layers and in the non-discrete second mask layer have top surfaces that are coplanar.

20. The method according to claim 1, wherein the step of forming discrete repeating patterns in the first region of the target material layer and the non-discrete pattern in the second region of the target material layer includes:
using the plurality of discrete first mask layers on the first region of the target material layer and the non-discrete second mask layer on the second region of the target material layer as a mask layer to etch the target material layer to form discrete repeating patterns and the non-discrete pattern.

* * * * *